US009696357B2

(12) United States Patent
Voisine

(10) Patent No.: US 9,696,357 B2
(45) Date of Patent: Jul. 4, 2017

(54) ELEMENT RESISTANCE MEASUREMENT IN AN ELECTRICITY METER

(71) Applicant: Landis+Gyr, Inc., Lafayette, IN (US)

(72) Inventor: John T. Voisine, Lafayette, IN (US)

(73) Assignee: Landis+Gyr, Inc., Lafayette, IN (US)

( * ) Notice: Subject to any disclaimer, the term of this patent is extended or adjusted under 35 U.S.C. 154(b) by 860 days.

(21) Appl. No.: 13/931,349

(22) Filed: Jun. 28, 2013

(65) Prior Publication Data
US 2015/0006095 A1    Jan. 1, 2015

(51) Int. Cl.
*G01R 27/14* (2006.01)
*G01R 31/327* (2006.01)
*G01R 27/20* (2006.01)

(52) U.S. Cl.
CPC ........... *G01R 27/14* (2013.01); *G01R 27/205* (2013.01); *G01R 31/3274* (2013.01)

(58) Field of Classification Search
CPC ... G01R 27/14; G01R 27/205; G01R 31/3274
USPC ....... 702/65; 324/691, 713, 620, 142, 76.11;
327/438, 108, 441; 340/870.28, 870.17
See application file for complete search history.

(56) References Cited

U.S. PATENT DOCUMENTS 5,181,026 A * 1/1993 Granville ............. G01R 15/183
324/96
6,028,471 A * 2/2000 Koyama ................ H01H 9/542
327/108
7,683,642 B2 * 3/2010 Martin ................. G01R 27/205
324/142
8,928,294 B2 * 1/2015 Yamada .................... G05F 1/10
323/222
2008/0116906 A1 * 5/2008 Martin ................. G01R 31/043
324/691

(Continued)

FOREIGN PATENT DOCUMENTS

JP         H08114634 A     5/1996

OTHER PUBLICATIONS

International Search Report and Written Opinion for PCT/US2014/044754, EPO, Nov. 5, 2014.

(Continued)

*Primary Examiner* — Carol S Tsai
(74) *Attorney, Agent, or Firm* — Maginot, Moore & Beck LLP

(57) ABSTRACT

A method measures a resistance of an element that is operably coupled to receive an AC line voltage. The method includes obtaining a first voltage measurement value V1A from a first side of the element at a first time, and obtaining a second voltage measurement value V2A from a second side of the element at the first time. The method also includes obtaining a first current measurement value IA through the element at the first time, and obtaining a second current measurement value IB through the element at the second time. The method further includes obtaining a third voltage measurement value V1B from the first side of the element at a second time, and obtaining a fourth voltage measurement value V2B from the second side of the element at the second time. The processing device determines the resistance at least in part based on the values V1A, V2A, V1B, V2B, IA and IB. The determination based on an adjusted difference of V2B and V2A.

21 Claims, 4 Drawing Sheets

(56) References Cited

U.S. PATENT DOCUMENTS

2009/0115427 A1* 5/2009 Radtke .................. G01R 27/16
324/629
2010/0036625 A1* 2/2010 Martin .................. G01R 22/10
702/62

OTHER PUBLICATIONS

KEVCD A, Indoor Combined Sensor; Indoor Current Sensor, ABB, XP055084794, Apr. 30, 2011, pp. 1-8.

* cited by examiner

ELEMENT RESISTANCE MEASUREMENT IN AN ELECTRICITY METER

FIELD OF THE INVENTION

The present invention relates generally to the field of electricity meters, and particularly to measurement of resistance of elements within the electricity meter.

BACKGROUND

Electricity meters that measure energy consumption or power consumption typically connect between a utility power line and a load. For example, an electricity meter for a residential customer is often connected at the point at which the electrical system of the residence connects to the utility line. The meter may thereby perform measurements regarding the energy consumed by the load.

Utility meters often include one or more electrical contacts across which the load voltage and a significant amount of current may be found. For example, certain meters have switches that allow for controllable connection and disconnection of electrical service to the customer, i.e., the load. Such switches necessarily have substantial contacts to carry the entire customer load current, often in excess of 100 amps, during normal operation. There exists a potential for degradation of the switch contacts, particularly if the switches are used with some frequency. Degradation of the switch contacts increases the resistance over the switch contacts. Such resistance creates additional power loss within the meter, which is undesirable.

To address this issue, U.S. Pat. No. 7,683,642 shows a method and arrangement for monitoring meter contact integrity that determines a voltage drop across, or a resistance of, a contact associated with a utility meter. The method uses in part existing meter circuitry for determining voltages, currents and the like. FIG. 2 of U.S. Pat. No. 7,683,642 and the accompanying drawings shows how the resistance of a service switch contact may be determined using voltage measurements on either side of the switch, and the current measured on the line running through the switch.

Although U.S. Pat. No. 7,683,642 describes a suitable way to determine resistance of a service switch (and/or other electrical contacts) within an electricity meter, there is a need for higher accuracy. In particular, because of voltage drop across the contacts can be very small, and large common mode voltage, the tolerance of the measurement circuitry in some applications can cause significant errors in the contact resistance measurement.

In particular, a meter measurement circuit may determine voltage with a relatively tight tolerance of ±0.1% error. In such a circuit, the voltage measurement error on a 240 volt electrical system can be as much as 240 mV. Moreover, because contact resistance measurements involve measuring voltage on both sides a switch contact at approximately line voltage, the maximum error for a given measurement can be twice as much, or 480 mV. This error can be significant when measuring the relatively small voltage drops across a service switch or other low resistance element.

One solution to the issue is to employ high precision voltage measurement components such that the circuit has tighter error tolerance, for example, an order of magnitude better than 0.1%. Unfortunately, the cost of such components can add significantly to meter cost.

Accordingly, there is a need for method and arrangement for measuring contact resistance within a utility meter that has reduced error without necessarily implementing extremely high precision components.

SUMMARY OF THE INVENTION

The present invention address the above described needs, as well as others by performing voltage measurements on one or both sides of a switch or other element at different times when the line current through the contact or element is different. Based on those sets of voltage measurements and accompanying current measurements, a processing circuit determines the contact resistance. With the methods discussed herein, a significant improvement over prior art methods can be achieved even without higher precision components.

In one embodiment, a method measures a resistance of an element that is operably coupled to receive an AC line voltage. The method includes obtaining a first voltage measurement value V1A from a first side of the element at a first time, and obtaining a second voltage measurement value V2A from a second side of the element at the first time. The method also includes obtaining a first current measurement value IA through the element at the first time, and obtaining a second current measurement value IB through the element at the second time. The method further includes obtaining a third voltage measurement value V1B from the first side of the element at a second time, and obtaining a fourth voltage measurement value V2B from the second side of the element at the second time. The processing device determines the resistance at least in part based on the values V1A, V2A, V1B, V2B, IA and IB. The determination based on an adjusted difference of V2B and V2A.

Another embodiment is a circuit configured to carry out at least a portion of the method described above.

The above described features and advantages, as well as others, will become more readily apparent to those of ordinary skill in the art by reference to the following detailed description and the accompanying drawings.

DETAILED DESCRIPTION

Figure 1:
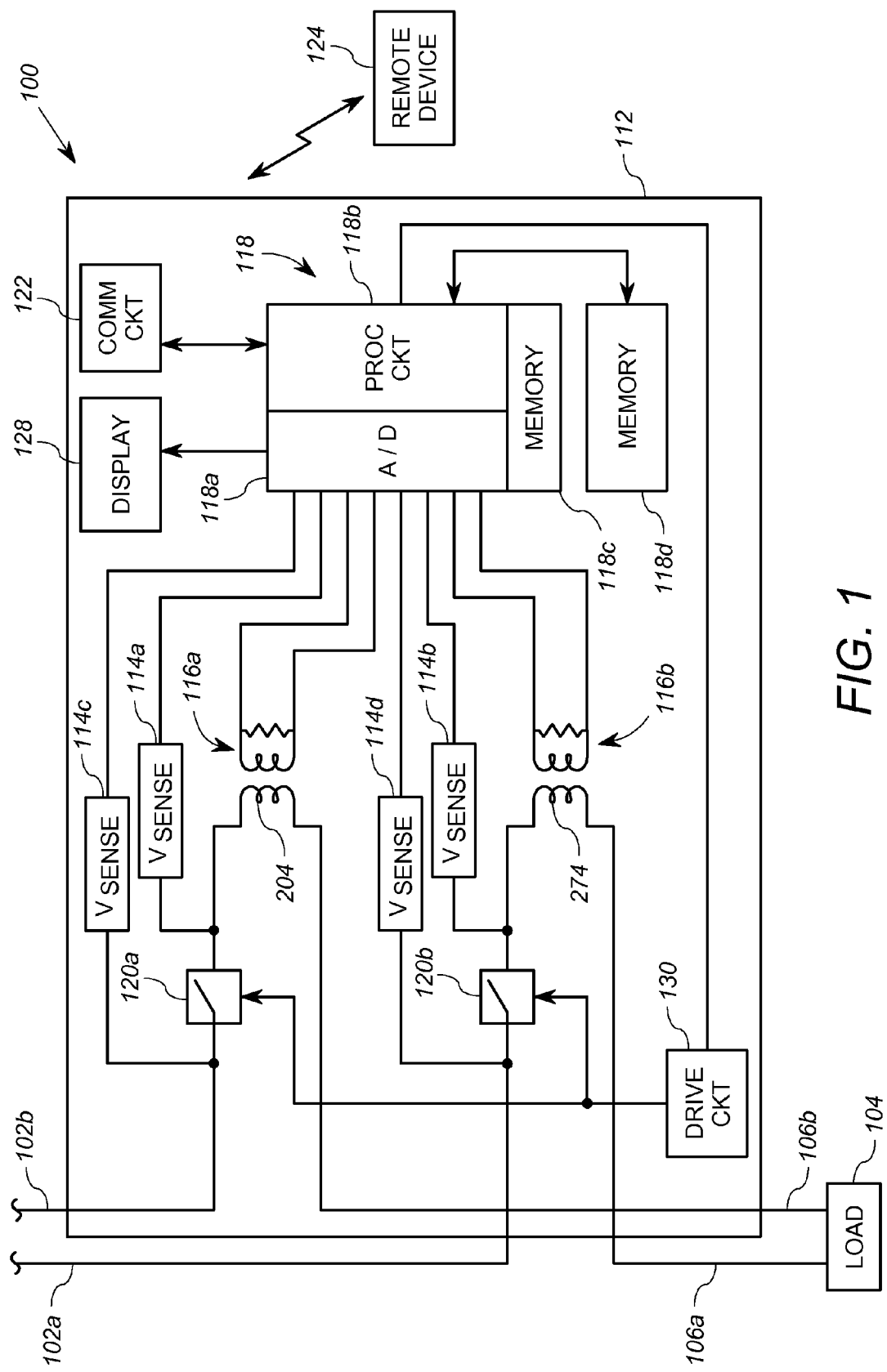
FIG. 1 shows a schematic block diagram of an exemplary meter having a measurement arrangement that incorporates a first embodiment of the invention.

Referring now to the drawings, and more particularly to FIG. 1, a diagram of an electrical utility meter 100 constructed according to aspects of the present invention is shown. It will be appreciated that the one or more inventive aspects described herein may be implemented in many configurations of electricity meters, wherein the meter includes electrical elements in series with the AC line voltage, and is not limited to one having the specific architecture of the meter in FIG. 1.

In FIG. 1, the meter 100 is operably coupled to utility power lines 102a, 102b. The utility power lines 102a, 102b are connected to a source of electricity, such as a power transmission and distribution system, not shown. A load 104 (typically a consumer of electrical power) is connected to the power lines 102a, 102b through respective feeder lines 106a, 106b. The meter 100 is operably coupled at the intersection of the feeder lines 106a, 106b and the power lines 102a, 102b to detect the amount of electricity delivered to the load 104. In the exemplary meter 100, the components of the meter 100 actually provide the connection between the power lines 102 and the feeder lines 106. The meter 100 is operable to, among other things, generate metering information representative of a quantity of electrical energy delivered to the load 104.

The meter 100 disclosed herein includes a housing 112, first and second current coils 204, 274, first, second, third and fourth voltage sensors 114a, 114b, 114c, 114d, first and second current sensors 116a, 116b, electronic meter processing circuitry 118, a service switch arrangement 120 that includes service switches 120a, 120b, a communication circuit 122, a display 128, and a drive circuit 130.

The housing 112 is disposed over the meter 100 and encases various components thereof. For example, the voltage sensors 114a-114d, the current sensors 116a, 116b, the processing circuit 118, the service switch arrangement 120, the communication circuit 122, the display 128 and the drive circuit 130 are all supported within or at least on the housing 112. Various meter housing types, forms and shapes are known and are suitable for use as the housing 112. For example, in meters used in the United States, electricity meter housings are generally cylindrical in shape, while in other countries, the housing may be rectangular in shape. The housing 112 generally protects the components of the meter 100 from environmental conditions, thereby allowing the meter 100 to be placed outside, in an industrial setting, or elsewhere.

The meter 100 connects to the power lines through a series of blades on the meter and respective jaws in a meter socket, not shown, but which are known in the art. When the meter 100 is properly installed, the first power line 102a is coupled to the first feeder line 106a via the first switch 120a and the current coil 204, and the second power line 102b is coupled to the second feeder line 106b via the second switch 120b and the current coil 274.

The voltage sensors 114a, 114b, 114c and 114d and current sensors 116a, 116b are secured within the housing 112. The voltage sensor 114c is operably coupled to a first side of the first switch 120a, between the first switch 120a and the power line 102a. The voltage sensor 114c is configured to generate a first voltage measurement signal representative of the line voltage at the first side of the first switch 120a. The voltage sensor 114a is operably connected to a second side of the first switch 120a, between the switch 120a and the current coil 204 in this embodiment. The voltage sensor 114a is configured to generate a second voltage measurement signal representative of the line voltage at the second side of the switch 120a. The second voltage measurement signal is representative of the line voltage delivered to the load 104 via the feeder line 106a. The voltage sensor 114b is operably connected to a second side of the second switch 120b, between the switch 120b and the current coil 274 in this embodiment. The voltage sensor 114b is configured to generate a third voltage measurement signal representative of the line voltage at the second side of the switch 120b. The third voltage measurement signal is representative of the line voltage of the load 104 at the feeder line 106b. The voltage sensor 114d is operably coupled to a first side of the second switch 120b, between the second switch 120b and the power line 102b. The voltage sensor 114d is configured to generate a fourth voltage measurement signal representative of the line voltage at the first side of the second switch 120b.

The voltage sensors 114a, 114b, 114c, 114d may comprise any suitable voltage sensor, including a wire connection that simply obtains the voltage at their respective connection points. In the embodiment described herein, however, at least the voltage sensors 114a, 114b, 114c comprise voltage dividers that scale the received voltage signals to a suitable range for subsequent digitization and processing.

The current sensor 116a, which may suitably include a current sensor, is operably coupled to the current coil 204 to generate a first current measurement signal representative of current flowing through the current coil 204, and hence to the load 104 on feeder line 106a. Likewise, the current sensor 116b, which may also suitably include a current sensor, is operably coupled to the current coil 274 to generate a second current measurement signal representative of current flowing through the current coil 274, and hence to the load 104 on feeder line 106b. A suitable current sensor may comprise a toroidal transformer that extends around the current coils 204, 274, respectively.

For purposes of example and explanation, FIG. 1 illustrates two power lines 102a, 102b and feeder lines 106a, 106b for providing the load 104 with two-phase electrical service, or for two sides of a 240-volt single-phase three-wire electrical service. However, it will be intuitive to those skilled in the art that the principles of the present invention may also be applied to three-phase power systems.

The processing circuit 118 is a circuit configured to receive the analog measurement signals from the voltage sensors 114a, 114b, 114c, 114d and the current sensors 116a, 116b and determine a resistance or voltage drop over the switches 120a, 120b. According to an exemplary embodiment, the processing circuit 118 includes an analog to digital ("A/D") converter 118a that receives and digitizes the measurement signals, and digital processing circuitry 118b that processes the digitized measurement signals to thereby generate the measurement of the resistance over each of the switches 120a, 120b. In this embodiment, at least some of the digital processing circuit 118b and the A/D converter 118a are housed in a single integrated circuit chip. However, it will be appreciated that different embodiments, the processing circuit may have a different physical configuration, and may include two or more processing devices.

In any event, the processing circuit 118 further includes internal memory 118c and external memory 118d. The internal memory 118c is disposed within the same integrated circuit as the digital processing circuit 118b. The internal memory 118c may suitably include, but is not limited to, random access memory. The external memory 118d may suitably include a non-volatile memory such as flash memory, EEPROM, or other non-volatile memory In general, the processing circuit 118 is configured to sample the voltage and current measurement waveforms received from the sensors 114a-114d and 116a-116b. The processing circuit is configured to generate corresponding digital voltage and current values, and operates as discussed below in connection with FIGS. 2 and 3 to determine the resistance values based on the corresponding digital voltage and current values. The processing circuit 118 is further configured to store the generated resistance values in at least one of the memories 118c, 118d. The processing circuit 118 may also process the generated resistance values to determine whether a fault or other condition exists with regard to the switches 120a, 120b.

The processing circuit 118 is further configured to generate energy consumption data from the analog measurements from the voltage sensors 114a, 114b, (or alternatively, voltage sensors 114c, 114d), and the current sensors 116a, 116b. In such an operation, the processing circuit 118 samples the voltage and current measurement waveforms, and then multiples contemporaneous samples of voltage and current to obtain a short duration energy measurement approximation (i.e. less than 1 millisecond). These sample-products are then accumulated to provide a measure of electricity consumption. Other variants and modifications of this basic formula are known and may be used and are known in the art.

According to an alternative embodiment, however, the processing circuit 118 generates the energy consumption data by operating directly upon the analog measurement signals. As is known in the art, the processing circuit 118 may include one or more integrated circuits.

The service switch circuit 120 in this embodiment comprises the two service switches 120a, 120b, the drive circuit 130, and a logical control portion, which in this case is disposed within (i.e. forms part of the operations of) the processing circuit 118. It will be appreciated that the logical control portion may be separate from, at least in part, from the processing circuit 118. The drive circuit 130 is a circuit that is configured to receive digital signals and is configured to controllably open or close the switches 120a, 120b in response to the received digital signals. Suitable drive circuits 130 for meter service switches 120a, 120b are known in the art.

The service switches 120a, 120b are operably coupled to selectively connect and disconnect the power lines 102 to the load 104 under the control of the processing circuit 118 via the drive circuit 130. In general, each of the service switches 120a, 120b has a connected state, a disconnected state, and an armed state. The states of the service switches 120a, 120b are maintained within the processing circuit 118.

More specifically, in the connected state, the service switches 120a, 120b are closed, and thereby couple the power lines 102 to the load 104 so as to provide electrical power thereto. In the disconnected and armed states, the service switches 120a, 120b are open, thereby operably decoupling the power lines 102 from the load 104 so as to remove the supply of electrical power therefrom. The "armed" state is a transitional state between the disconnected state and the connected state. The armed state is used to facilitate overall control of the switch from a remote location while allowing final connection decisions at the local level.

It is noted that the service switches 120a, 120b have physical contacts that are prone to wear and tear. As they wear, they can develop resistive qualities, which undesirably results in a large voltage drop and dissipation of power.

In the general operation of the service switch circuit 120, the service switch circuit 120 changes from the connected state to the disconnected state in response to a first signal received from the processing circuit 118, and changes from the disconnected state to the armed state in response to a second signal within the processing circuit 118. The processing circuit 118 provides these signals to the driver circuit 130.

It should be noted that the signals that cause the state changes may originate from a remote location from a remote device 124 via the communication circuit 122. For example, if a utility must shut down power to the load 104 for one or more reasons, the utility company may use the remote device 124 to provide a disconnect command to the meter 100.

To this end, the communication circuit 122 is configured to receive signals from the remote device 124 via a land-based communication link (e.g., cable, wire, fiber, etc.), via a wireless communication link, or a combination thereof. According to one embodiment, the communication circuit 122 is operable to receive a disconnect signal from the remote device 124. In response to the disconnect signal, the communication circuit 122 provides information representative of the disconnect signal to the processing circuit 118. The processing circuit 118 in turn provides the first signal to the driver circuit 130 of the service switch circuit 120, thereby causing the service switch circuit 120 to change from the connected state to the disconnected state. In the disconnected state, the service switches 120a and 120b disconnect the feeder lines 106 from the power lines 102.

The communication circuit 122 is also operable to receive an arm signal from the remote device 124. In response to the arm signal, the communication circuit 122 provides information representative of the arm signal to the processing circuit 118. The processing circuit 118 in turn provides the second signal to the service switch circuit 120, thereby causing the service switch circuit 120 to change from the disconnected state to the armed state. In the armed state, as discussed above, the switches 120a, 120b do not immediately reconnect the feeder line 106 to the power lines 102. In the armed state, the processing circuit 118 may suitably receive a user input signal, for example, through an externally accessible switch, not shown, which indicates that the user would like to reconnect the power.

The display 128 is operably coupled to the processing unit 118 and provides a visual display of information, such as information regarding the operation of the meter 100. For example, the display 128 may provide a visual display regarding the energy consumption measurement operations of the meter 100. The display 128 may also be configured to indicate the state of the service switch circuit 120, or at least when the service switch circuit 120 is in the armed state. As disclosed herein, the display 128 may also display when the processing circuit 118 determines when a connection (i.e. through either of the switches 120a, 120b) in the power line path of the meter 100 has a resistance that exceeds a threshold.

As discussed above, the service switches 120a, 120b have contacts that may be opened and closed from time to time, and which can carry relatively high voltage and current. The contacts of the switches 120a, 120b are prone to wear. An arrangement according to one embodiment of the invention incorporates various elements of the meter 100 to generate a measurement of resistance across the contacts of each switch 120a, 120b. If the resistance is too high, then it may indicate that the switches 120a, 120b need to be replaced or at least repaired.

In normal operation, the switches 120a, 120b are closed, and the load 104 receives electrical power from the power lines 102a, 102b via the respective feeder lines 106a, 106b. In this state, the voltage sensors 114a, 114b, 114c, 114d generate respective analog voltage measurement signals and the current sensors 116a, 116b generate respective analog current measurement signals. The A/D converter 118a of the processing circuit 118 receives the analog measurement signals from the voltage sensors 114a, 114b, 114c, 114d and the current sensors 116a, 116b, and generates digital sampled information, which constitute sampled waveforms, therefrom. The sampling rate may suitably be on the order of 1000 samples/sec or greater. The digital processing circuitry 118b receives the digital sampled waveforms from the A/D converter 118a and generates a number of calculations therefrom.

In particular, the digital processing circuitry 118b determines an energy consumption value from the digital sampled waveforms. In this embodiment, the digital processing circuitry 118b multiplies contemporaneous samples from the voltage sensor 114a and the current sensor 116a, and multiplies contemporaneous samples from the voltage sensor 114b and the current sensor 116b. The digital processing circuitry 118b then accumulates the resulting products in an ongoing manner to track and meter the energy consumption of the load. Other variants and modifications of this basic formula are known and may be used and are known in the art. The digital processing circuit 118b may then provide information representative of the calculated energy consumption values to the display 128, and/or to the communication circuit 122 for remote transmission.

The digital processing circuit 118b also performs other calculations, such as root-mean-square ("RMS") calculations of the voltages from the sensors 114a-114d and the currents from the sensors 116a, 116b. Calculation of RMS values from sampled waveforms is conventional. In this embodiment, RMS values are calculated from one second of samples. The digital processing circuit 118b thereby generates, in an ongoing manner, an RMS voltage value V1 representative of the voltage at from the first side of the switch 120a via voltage sensor 114c, an RMS voltage value V2 representative of the voltage from the second side of the switch 120a via voltage sensor 114a, an RMS voltage value V3 representative of the voltage from the first side of the switch 120b via the voltage sensor 114d, and an RMS voltage value representative of the voltage V4 from the second side of the switch 120b via the voltage sensor 114b. In this embodiment, the voltage V4 is set as a reference voltage, and therefore the RMS voltage is always zero. The digital processing circuit 118b further generates, in an ongoing manner, an RMS current value I1 of the current through the first switch 120a via current sensor 116a, and an RMS current value I2 of the current through the second switch 120b via the current sensor 116b. As will be discussed below in detail, the digital processing circuit 118b determines the resistance through the switch 120a based on the values V1, V2 and I1 from two different measurement times. In general, the resistance value is based on the change of voltages V1 and V2 and the change in the current I1 between the two selected measurement times. Similarly, the digital processing circuit 118b determines the resistance through the switch 120b based on the values of V3 and I2 at two different measurement times. In general, the resistance value is based on the change of the voltage V3 and the change in the current I2 between the two selected measurement times.

The digital processing circuit 118b stores the resistance measurement values in the memory 118c and/or 118d. In some embodiments, the digital processing circuit 118b can cause the display 128 to display a suitable message if a resistance measurement value, or an average or other statistical value based on multiple resistance measurement values, exceeds a predetermined threshold. Such a message could indicate to a meter reader, customer or other party that the switch 120a and/or 120b requires maintenance. The digital processing circuit 118b may alternatively, or in addition, cause such a message to be transmitted to a remote device (such as a computer at the utility service provider), not shown, via the communication circuit 122.

Figure 2:
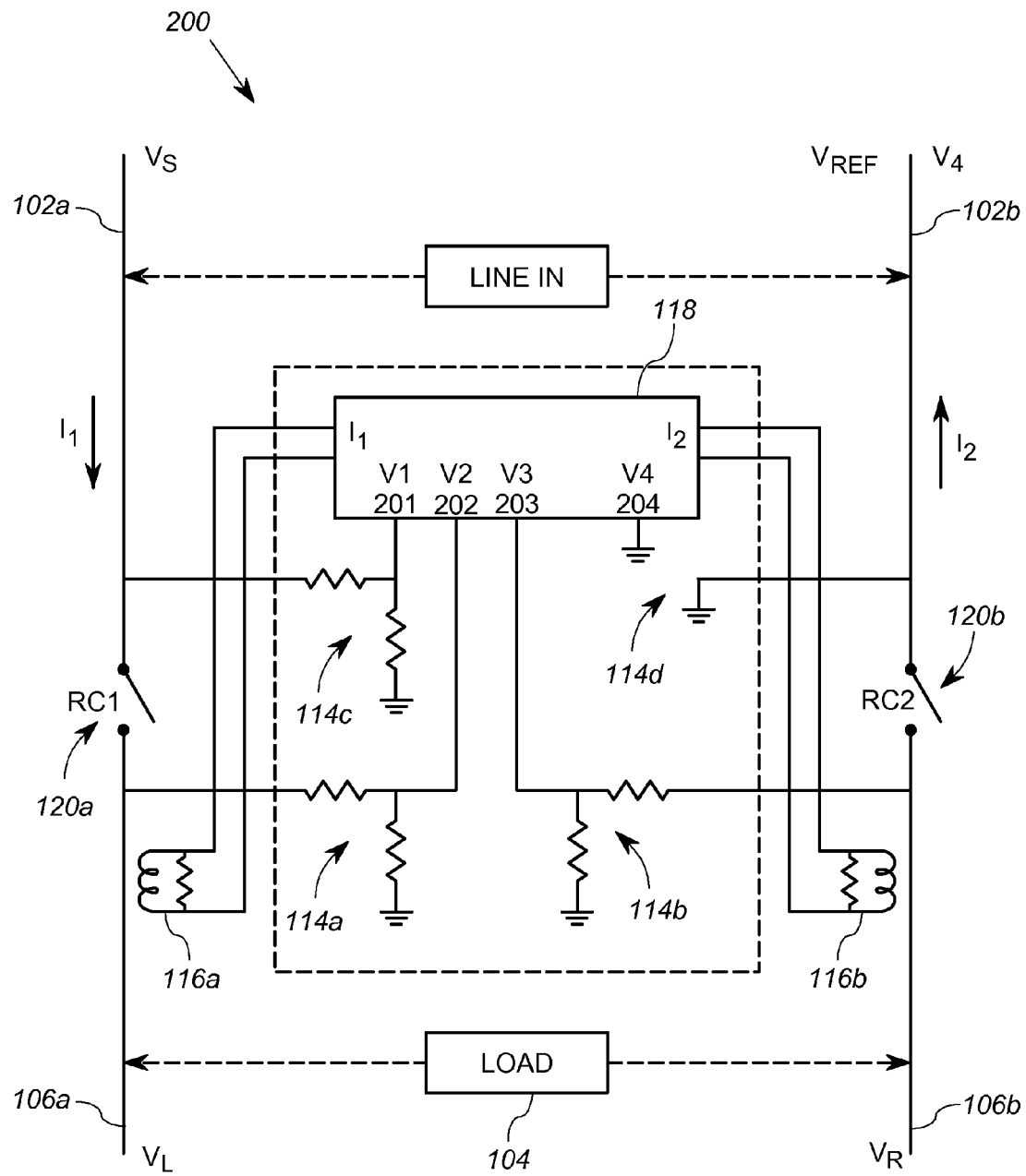
FIG. 2 shows a schematic block diagram of the measurement arrangement of FIG. 1.

FIG. 2 shows in further detail a measurement arrangement 200 within the meter 100 of FIG. 1 for determining the resistance across the switches 120a, 120b. It will be appreciated that the switches 120a, 120b may be replaced by other meter elements in order to determine the resistance across such elements. For example, the arrangement 200 may be configured to determine the resistance across meter blades or meter coils, or other devices having a relatively low resistance and carrying a relatively large voltage. The arrangement 200 may also be readily scaled to determine the resistance across fewer or more than two switches or devices.

Referring again to the embodiment described herein, the arrangement 200 includes the voltage sensors 114a, 114b, 114c and 114d, current sensors 116a, 116b, and the measurement circuit 118. As discussed above in connection with FIG. 1, the measurement circuit 118 includes both an A/D converter 118a for converting analog measurement signals into digital measurement signals, and a digital processing circuit 118b configured to perform measurements. In FIG. 2, such elements are referred to collectively as the processing circuit 118.

As shown in FIG. 2, the first voltage sensor 114c comprises a resistive voltage divider having an output connected to a first input 201 of the processing circuit 118. Similarly, the second voltage sensor 114a and the third voltage sensor 114b comprise resistive voltage dividers having outputs coupled to, respectively second and third inputs 202, 203 of the processing circuit 118. The fourth voltage sensor 114d in this embodiment is merely a wire connection that defines a reference voltage V4 from which all other voltage measurements are taken. To this end, the fourth voltage sensor 114d is merely a connection from the first side of the second switch 120b to the reference input 204 of the processing circuit 118. As discussed above, the processing circuit 118 generates RMS voltage values V1, V2, V3, V4 from such analog voltage measurement values.

As also shown in FIG. 2, the current sensor 116a is operably coupled to provide a first current measurement signal to the processing circuit 118, and the current sensor 116b is operably coupled to provide a second current measurement signal to the processing circuit 118. As discussed above the processing circuit generates RMS current values I1, I2, from the first and second current measurement signals.

Theory of Operation

The theory of operation of the arrangement 200 is discussed below. For purposes of the discussion, the actual line voltage at the first side of the switch 120a is referenced as VS, and the actual line voltage at the second side of the switch 120a is referenced as VL. Moreover, the actual line voltage at the first side of the switch 120b is referenced as Vref, and the actual line voltage at the second side of the switch 120b is referenced as VR. The resistance of the first switch 120a is referenced as RC1, and the resistance of the second switch 120b is referenced as RC2.

As is known, determining the contact resistance of the service switches 120a, 120b can be accomplished by measuring the voltage difference (e.g. V2−V1) across the contacts and dividing the result by the current (e.g. I1) through the switch. Typically resistance values for the switches 120a, 120b are very low, such as on the order of 200μΩ. Therefore, the measured voltage drop (e.g. V2−V1) for a typical load current of 100 amperes across the switch 120a would typically be of the order of 100 amps times 200μ-ohm, or 20 mV. Measuring a 20 mV signal on a line energized at 240 volts can be difficult and would require instrumentation that is highly stable. Moreover, such instrumentation would necessarily require a high common mode rejection of the order of −100 db or better. Instrumentation exhibiting the level of stability and common mode rejection required for measurement of switch contact resistance is not practical in an electricity meter.

In particular, the voltage drop across the contacts, e.g. 20 mV, is typically less than the normal voltage tolerance of reading of line voltages in the meter. For example, the sensor circuits 114a, 114b, 114c have error tolerances due to component tolerances and other factors. When the meter 100 is manufactured, the processing circuit 118 is programmed with calibration values K1, K2 and K3 that largely compensate for the tolerances of the respective sensor circuits 114c, 114a, and 114b. Such calibration operations are known. However, typical calibration operations have accuracy limits.

In a typical case, electricity meter measurement voltage sensor circuits, such as the sensors 114a, 114b, 114c, are calibrated to an accuracy of about ±0.1%. As discussed above, a typical voltage drop over a switch 120a (or other conductive element carrying AC line voltage) is on the order of 20 mV. Therefore, with a typical line voltage of 240 volts, the error in measuring $V_S$ and $V_L$ could be as large as 0.1% of 240 volts or 240 mV. Consequently, the error in determining the difference between $V_S$ and $V_L$ could be as large as 2×240 mv=480 mV. As a result, directly measuring the voltage drop across the switch contacts is not practical because the measurement error can be more than an order of magnitude larger than the voltage drop across switch 120a itself.

This problem of reading a small voltage in the presence of a large voltage is a well known instrumentation problem. A large voltage common to two signals being measured is referred to as common mode voltage. The measurement systems ability to ignore common mode voltage is referred to as common mode rejection.

It will be appreciated that the problem of a large common mode voltage is not present in reading the load side voltage $V_R$ in FIG. 2 because the processing circuit 118 references all voltages to $V_4$. At a load current of zero, voltage $V_R$ equals voltage $V_4$. Hence the common mode voltage is zero for $V_R$.

A second problem associated with a high common mode voltage is the effect of temperature on calibration. A typical sensor circuit (i.e. sensors 114a, 114b, 114c) may employ resistors in the voltage sense circuitry that have a temperature coefficient of 50 ppm per degree C. In the sensor circuit 114c of FIG. 2, if the resistors have a temperature coefficient of ±50 ppm per degree C., then the voltage signal V1 applied to input 201 of the processing circuit 118 could be in error by as much as ±100 ppm per degree C. Similarly, the sensor circuit 114a may provide a voltage to the input 202 that is in error by as much as ±100 ppm per degree C. Consequently, the voltage difference between the input 201 and the input 202 (i.e. V2−V1) could be in error by as much as ±200 ppm per degree C. If temperature were to vary by 10° C. from the temperature at calibration, the error in measuring the difference between V1 and V2 could be as high as ±2,000 ppm or 480 millivolts for a 240 volt line signal. Consequently, it becomes unfeasible to read a contact resistance voltage of 20 mV when a temperature change of only 10 degrees can cause a reading variation of 480 mV.

In accordance with one aspect of the invention, the issues of high common mode voltages and calibration limitations are addressed by determining resistance based on a change in measured voltages and currents after a change in line currents.

In particular, the arrangement 200 is configured to perform resistance measurements over a time where a relatively large change in load current has taken place. For example, if a household appliance of the load 104 turns on or turns off, such as an electric clothes dryer, hot water heater, or air conditioner, etc. then the change in voltage drop across the switch 102a, 102b due to the change in load current can be used to calculate resistance in such a way as to minimize the influences of initial calibration or temperature variations. For example, if the voltage drop across the switch 102a measured before the change in load current is compared to the voltage drop across the switch 102a after the change in load current, errors associated with large common mode voltages can be negated. As a consequence, the resistance of the switch 102a can be determined to a much greater level of accuracy than by the prior art methods.

Various methods of determining resistance are discussed below. In general, the processing circuit 118 performs operations shown in FIG. 3 to carry out the measurement of the resistance of the switches 120a and 120b of FIGS. 1 and 2.

In step 305, the processing circuit 118 obtains the values V1, V2 and I1 at a first time t1, hereinafter noted as $V1_{t1}$, $V2_{t1}$, and $I1_{t1}$, from the respective sensors 114c, 114a and 116a. In step 310, the processing circuit 118 obtains the values V1, V2 and I1 at a second time t2, hereinafter noted as $V1_{t2}$, $V2_{t2}$, and $I1_{t2}$, from the respective sensors 114c, 114a and 116a. As will be discussed below, the processing circuit 118 may use the above-identified values to determine the resistance RC1 across the switch 120a.

Similar, but not identical, measurements are made for the switch 120b. In step 315, the processing circuit 118 obtains the values V3, V4 and I2 at a first time t1, hereinafter noted as $V3_{t1}$, $V4_{t1}$, and $I2_{t1}$, from the respective sensors 114b, 114d and 116b. In step 320, the processing circuit 118 obtains the values V3, V4 and I2 at a second time t2, hereinafter noted as $V3_{t2}$, $V4_{t2}$, and $I2_{t2}$, from the respective sensors 114b, 114d and 116b.

In step 325, the processing circuit 118 further determines whether the current measurement $I1_{t1}$ differs from the later current measurement $I1_{t2}$ by more than a predetermined amount. The predetermined amount represents the amount of current change that will trigger a resistance measurement in the processing circuit 118. If the first current measurement I1 has not changed significantly from time t1 to t2, then a resistance measurement may not be particularly informative or accurate. If, however, the first current measurement I1 has changed by a predetermined amount from time t1 to t2, then it is advantageous to perform the resistance calculation. The predetermined amount or threshold may suitable be [100 amps?].

Accordingly, if the answer in step 325 is to the negative, then the processing circuit 118 skips to step 340. If, however, the answer in step 325 is affirmative, then the processing circuit 118 proceeds to step 330 to calculate the resistance. In step 330, the processing circuit 118 determines the resistance RC1 at least in part based on the first voltage measurements $V1_{t1}$, $V1_{t2}$, the second voltage measurements $V2_{t1}$, $V2_{t2}$, and the first current measurements $I1_{t1}$ and $I1_{t2}$.

In a first embodiment, the processing circuit 118 generates the resistance value using the following calculation:

$$RC1 = \frac{(V1_{t1} - V1_{t2})/K1 - (V2_{t1} - V2_{t2})/K2}{I1_{t1} - I1_{t2}} \quad (1)$$

wherein K1 is the calibration constant or correction factor for the sensor circuit 114c, and K2 is the calibration constant or correction factor for the sensor circuit 114a. In the embodiment discussed herein, the calibration constants or correction values K1, K2 are generated for the specific sensors 114a, 114c using known methods. For example, a calibration operation may involve comparing the voltage measurement provided by the sensor circuits 114a and 114c via processing circuit 118 to an expected voltage value from a precision voltage source. Many suitable sensor calibration methods for metering are known. In this embodiment, the values K1 and K2 correct the outputs of the sensor circuits 114c, 114a, respectively, to an accuracy of ±0.1%.

Accordingly, Equation (1) provides a resistance value based on the difference of the voltage drop over switch 120a at two different current levels. The difference of the voltage drop over the switch 120a is divided by the corresponding difference in current levels. An issue with Equation (1), however, is that for some calibration levels, the error in the resistance measurement can still be significant.

In particular, the voltage swings in measured line voltage (e.g. VS) after a significant change in current can be on the order of 10 volts. Thus, $V1_{t1}-V1_{t2}$ and $V2_{t1}-V2_{t2}$ can each be as much as 10 volts. If the calibration constants K1 and K2 provide precision accuracy up to ±0.1%, then the error in resistance measurements can be substantial, particularly since the voltage drop over the switch 120a is likely on the order of less than one hundred mV.

Accordingly, in another embodiment, the processing circuit 118 generates the resistance measurement RC1 using the following equation:

$$RC1 = \frac{1}{K2} \frac{\left\{V2_{t2}\left[\frac{V1_{t1}}{V1_{t2}}\right] - V2_{t1}\right\}}{\left\{I1_{t1} - \left[\frac{V1_{t1}}{V1_{t2}}\right]I1_{t2}\right\}} \quad (2)$$

Equation (2) above was derived using the following rationale:

In equation (1), the value RC1 exhibits a large sensitivity to the calibration accuracy of K1 and K2 and to variations in source voltage VS, due to loading. One way to reduce the sensitivity to the calibration accuracy of K1 and K2 is to eliminate one of these constants from the equation for calculating RC1. To this end, it is noted that if the source voltage VS remained constant (i.e. no 10 volt variation after the change in load current), then the first voltage measurement V1 would also not change: In other words, $V1_{t1}=V1_{t2}$. Thus, if the source voltage remains constant, then the constant K1 of Equation (1) could be eliminated by substituting $V1_{t1}$ for $V1_{t2}$ as follows:

$$RC1 = \frac{(V2_{t1} - V2_{t2})/K2}{I1_{t1} - I1_{t2}} \quad (3)$$

Not only would holding constant the source voltage VS (and hence V1) eliminate the need for calibration constant K1, it would also reduce the influence of the calibration constant K2 on the error. Thus, it will be appreciated that the above equation (3) may be used in step 330 in cases where the source voltage VS does not vary significantly as a function of current change.

However, if the source voltage VS cannot be counted on to remain relatively constant, then another method must be used to eliminate one of the sources of error, such as K1. Eliminating K1 from equation (1) can be accomplished by applying a boundary condition as follows:

$$VS_{t1} = I1_{t1}*RC1 + I1_{t1}*RL = I1_{t1}*RC1 + VL_{t1} \quad (4)$$

$$VS_{t2} = I1_{t2}*RC1 + I1_{t2}*RL = I1_{t2}*RC1 + VL_{t2} \quad (5)$$

where RL represents a constant load resistance for the load 104. Using equation (5), the source voltage at the time t2, $VS_{t2}$, can be mathematically adjusted to equal the source voltage at the time t1, $VS_{t1}$, by multiplying both sides of the equation by the ratio $(VS_{t1}/VS_{t2})$. Moreover, it will be appreciated that the ratio of $(VS_{t1}/VS_{t2})$ is equal to the ratio of $(V1_{t1}/V1_{t2})$:

$$\frac{VS_{t1}}{VS_{t2}} = \frac{V1_{t1}/K1}{V1_{t2}/K1} = \frac{V1_{t1}}{V1_{t2}} \quad (6)$$

Multiplying both sides of Equation (5) with the equivalency of Equation (6) yields:

$$VS_{t1} = (V1_{t1}/V1_{t2})*(I1_{t2}*RC1 + I1_{t2}*RL) = (V1_{t1}/V1_{t2})*(I1_{t2}*RC1 + VL_{t2}) \quad (7)$$

Equation (7) demonstrates that VS can be represented as a function of V1 without the constant value K1. Referencing now the basic Ohm's law equations for RC1 at each time t1, t2:

$$RC1 * I1_{t1} = \frac{V1_{t1}}{K1} - \frac{V2_{t1}}{K2} \quad (8)$$

$$RC1 * I1_{t2} = \frac{V1_{t2}}{K1} - \frac{V2_{t2}}{K2} \quad (9)$$

If both sides of Equation (9) are multiplied by $V1_{t1}/V1_{t2}$, the result is as follows:

$$\left[\frac{V1_{t1}}{V1_{t2}}\right]RC1 * I1_{t2} = \quad (10)$$

$$\left[\frac{V1_{t1}}{V1_{t2}}\right]\frac{V1_{t2}}{K1} - \left[\frac{V1_{t1}}{V1_{t2}}\right]\frac{V2_{t2}}{K2} = \frac{V1_{t1}}{K1} - \left[\frac{V1_{t1}}{V1_{t2}}\right]\frac{V2_{t2}}{K2}$$

If one were then to subtract respective sides of Equation (10) from both sides of Equation (8):

$$RC1 * I1_{t1} - \left[\frac{V1_{t1}}{V1_{t2}}\right]RC1 * I1_{t2} = \frac{V1_{t1}}{K1} - \frac{V2_{t1}}{K2} - \frac{V1_{t1}}{K1} + \left[\frac{V1_{t1}}{V1_{t2}}\right]\frac{V2_{t2}}{K2} \quad (11)$$

This equation simplifies to:

$$RC1\left(I1_{t1} - \left[\frac{V1_{t1}}{V1_{t2}}\right]I1_{t2}\right) = -\frac{V2_{t1}}{K2} + \left[\frac{V1_{t1}}{V1_{t2}}\right]\frac{V2_{t2}}{K2} \quad (12)$$

and then:

$$RC1\left(I1_{t1} - \left[\frac{V1_{t1}}{V1_{t2}}\right]I1_{t2}\right) = \frac{1}{K2}\left(\left[\frac{V1_{t1}}{V1_{t2}}\right]V2_{t2} - V2_{t1}\right) \quad (13)$$

This final equation resolves to equation number (2):

$$RC1 = \frac{1}{K2} \frac{\left\{V2_{t2}\left[\frac{V1_{t1}}{V1_{t2}}\right] - V2_{t1}\right\}}{\left\{I1_{t1} - \left[\frac{V1_{t1}}{V1_{t2}}\right]I1_{t2}\right\}} \quad (2)$$

Thus, Equation (2) represents a significant reduction in the measurement error of RC1 in the event that the voltage source VS changes by a significant degree between t1 and t2, and in the event that that calibration constants K1 and K2 are within the normal range of electricity meter calibration constants, such as ±0.1%.

Referring again to step 330, it will therefore be appreciated that, depending on the accuracy of the calibration constants K1, K2 and the typical swing of the line voltage VS between t1 and t2, any of Equations (1), (2) or (3) may be used, with equation (2) being the most resilient. All of the equations determine RC1 based at least in part on the change in voltage in V2 and I1 between the times t1 and t2. After step 330, the processing circuit 118 proceeds to step 335.

In step 335, the processing circuit 118 stores the resistance value RC1 in the memory 118d. The resistance value RC1 may be stored as a single value (or series of values taken over time), or stored as a record including a time and date stamp. In addition, the processing circuit 118 may suitably calculate an average (or other statistically filtered) RC1 value from a plurality of previously stored RC1 values to eliminate noisy data. In any event, after step 335, the processing circuit 118 proceeds to step 340.

In step 340, the processing circuit 118 determines whether the second current measurement $I2_{t1}$ differs from the later current measurement $I2_{t2}$ by more than the predetermined amount, similar to step 325. If not, then the processing circuit 118 skips to step 355. If so, however, then the processing circuit 118 proceeds to step 345 to calculate the resistance RC2 of the switch 120b. It will be appreciated that in some embodiments the calculation of the resistance of the switch 120b will occur every time that the resistance of the switch 120a is calculated in step 335. In such a case, the condition statement of step 340 would not be necessary.

Referring to step 345, the calculation of the resistance of the second switch 120b is simpler than calculating the resistance of the switch 120a in the present embodiment. In general, the processing circuit 118 determines the resistance RC2 at least in part based on the third voltage measurements $V3_{t1}$, $V3_{t2}$, the fourth voltage measurements $V4_{t1}$, $V4_{t2}$, and the first current measurements $I2_{t1}$ and $I2_{t2}$. Because V4 is considered the reference value at all times, however, it does not change. As a consequence, the equation for RC2 is equivalent to equation (1):

$$RC2 = \frac{(V3_{t1} - V3_{t2})/K3 - (V4_{t1} - V4_{t2})/K4}{I2_{t1} - I2_{t2}} \quad (14)$$

wherein K3 is the calibration constant for the voltage sensor 114b. Because the voltage sensor 114d is simply a conductor, K4 can be considered to be 1. Moreover, because V4 remains the reference voltage and is treated as a constant, the above equation resolves to:

$$RC2 = \frac{(V3_{t1} - V3_{t2})/K3}{I2_{t1} - I2_{t2}} \quad (15)$$

After step 345, the processing circuit 118 proceeds to step 350.

In step 350, the processing circuit 118 stores the resistance value RC2 in the memory 118d. As with the resistance value RC1, the resistance value RC2 may be stored as a single value (or a series of RC2 values taken over time), or stored value as a record including a time and date stamp. In addition, the processing circuit 118 may suitably calculate an average RC2 value from a plurality of previously stored RC2 values to eliminate noisy data. In any event, after step 350, the processing circuit proceeds to step 355.

Figure 3:
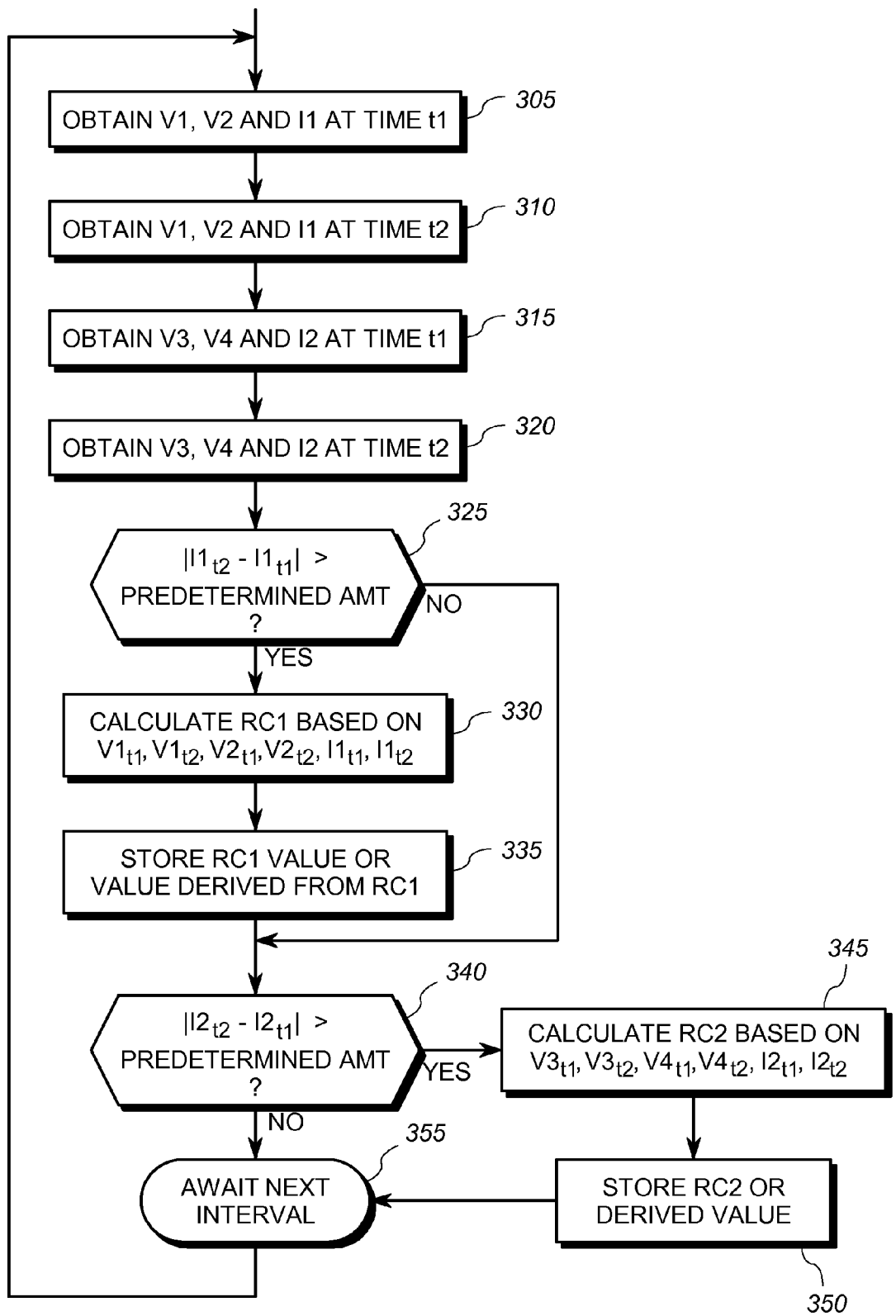
FIG. 3 shows a flow diagram of an exemplary set of operations of the processing circuit of the measurement arrangement of FIG. 2.

The processing circuit 118 in step 355 waits a suitable time before repeating the steps of FIG. 3. After a suitable time, possibly dictated by a timed interrupt or as otherwise indicated by the processing circuit 118, the processing circuit 118 repeats the process by returning to step 305. The time interval may suitably be 1 second.

It will be appreciated that the timing and sequence of operations of FIG. 3 may be carried out in several ways. For example, it is possible that steps 305 and 310 involve periodically calculating and storing multiple (i.e. more than two) values of each of V1, V2, V3, I1 and I2. In such a case, the processing circuit 118 could, based on a suitable difference between any two of the values of I1, identify which samples are to be used in the equations (1), (2), (3) and/or (15). In other words, the processor identifies the sample times t1 and t2 for the operations of FIG. 3 based on when a current change is detected. The processing circuit 118 may, for example, define the sample time t1 as the time immediately before the change in load current, and define the sample time t2 as the time immediately after the load current change.

It will be appreciated that in order to account for changes in temperature and aging conditions that can further affect the accuracy of the calibration constants K1, K2 and K3, it is preferable that the sample times t1 and t2 be proximate in real time, such that the temperature conditions at the two times t1 and t2 are likely to be substantially similar. For example, it is preferable that the sample times t1 and t2 be no more than an hour or two apart, and preferably less than fifteen minutes apart.

Figure 4:
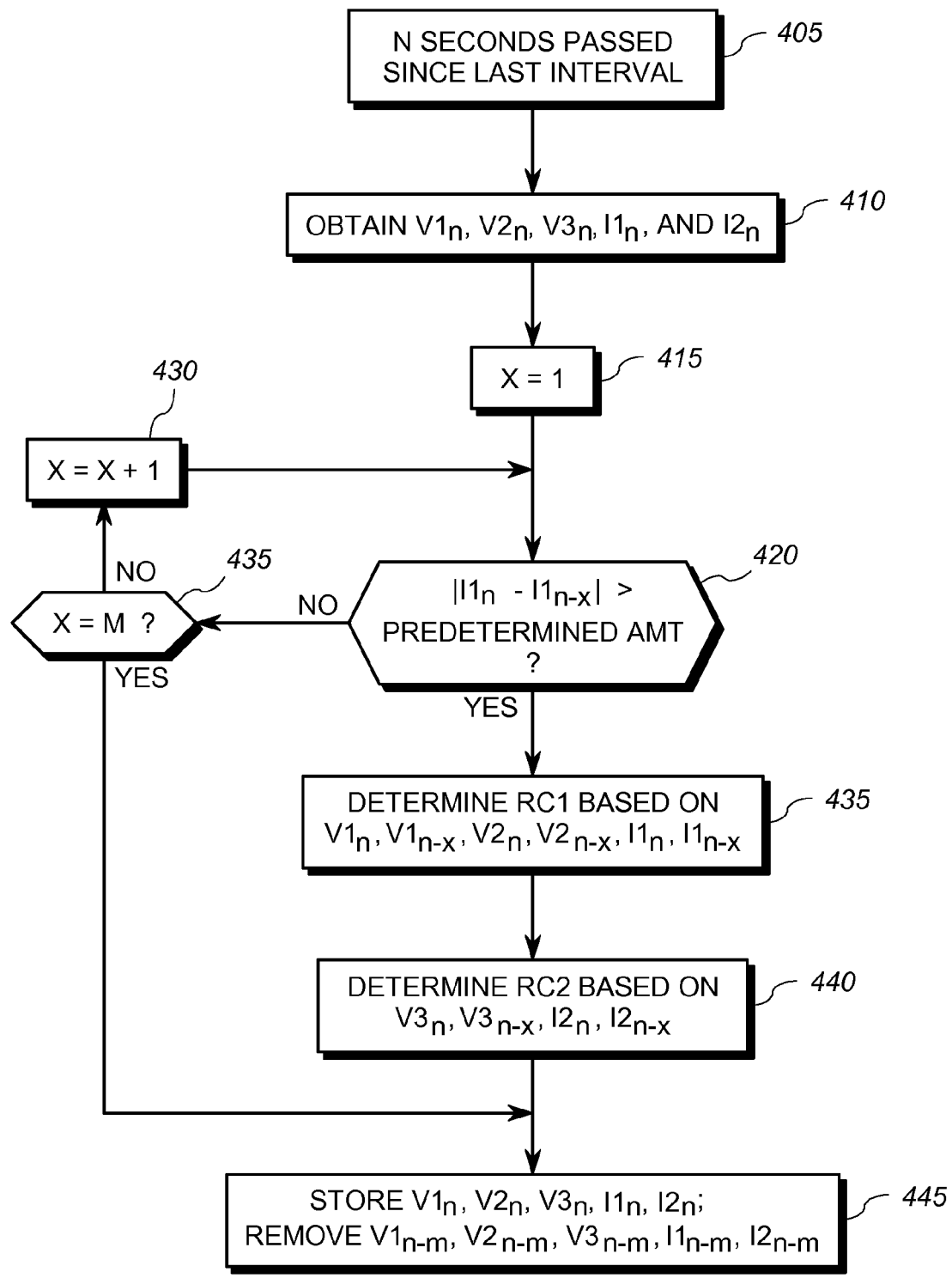
FIG. 4 shows a flow diagram of an alternative set of operations of the processing circuit of the measurement arrangement of FIG. 2.

FIG. 4 shows an alternative to the operations of FIG. 3 that provides an example of how timing considerations may be implemented into the arrangement of FIG. 2. In this example, the operations of FIG. 4 are carried out at intervals every N seconds. The memory 118c within the processing circuit 118 stores the previous M values of each of V1, V2, V3, I1 and I2. In one example, the value of N may suitably be 15 seconds, and the value of M may suitably be four. Thus, in this example, one minute's worth of samples of V1, V2, V3, I1 and I2 are stored in the memory 118c. In general, for any interval n, which corresponds to a specific time, the memory 118c has stored within it the values $V1_{n-1}$, $V1_{n-2}$, ... $V1_{n-M}$, $V2_{n-1}$, $V2_{n-2}$, ... $V2_{n-M}$, and so forth, from the previous M intervals.

In step 405, the processing circuit 118 determines that N seconds has passed since the last pass through of the flow diagram of FIG. 4, and starts the next interval n. The processing circuit 118 then proceeds to step 410, and obtains $V1_n$, $V2_n$, $V3_n$, $I1_n$, and $I2_n$. Thereafter, in step 415, the processing circuit 118 sets a counter x=1. In step 420, the processing circuit 118 determines whether $I1_n$ differs from any of $I1_n$, by more than the predetermined amount or threshold. If $I1_n$ differs from the value $I1_n$, by more than the predetermined amount, then the processing circuit 118 proceeds to step 435. If not, then the processing circuit 118 executes step 425.

In step 425, the processing circuit 118 determines whether x=M. In other words, the processing circuit 118 determines whether $I1_n$ has been compared to all prior stored values of I1. If so, then the process is complete and the processing circuit 118 proceeds to step 435. If not, then the processing circuit 118 increments x in step 430 and returns to step 420 as discussed above.

In step 435, however, which occurs when $I1_n$ differs from the value $I1_n$ by more than the predetermined amount, the processing circuit 118 determines the resistance RC1 based on $V1_n$, $V2_n$, $V1_{n-x}$, $V2_{n-x}$, $I1_n$, and $I1_{n-x}$, using any of the equations (1), (2) or (3), depending on the factors discussed above in connection with FIG. 3. In applying equations (1), (2) or (3) in step 435, the value of n-x is substituted for t1, and the value of n is substituted for t2. The processing circuit 118 may then store and/or process the calculated RC1 value as discussed above in connection with step 335.

In step 440, the processing circuit 118 determines the resistance RC2 based on $V3_n$, $V3_{n-x}$, using equation (14). In applying equation (14) in step 440, the value of n-x is substituted for t1, and the value of n is substituted for t2. The processing circuit 118 may then store and/or process the calculated RC2 value as discussed above in connection with step 335. After step 440, the processing circuit 118 proceeds to step 445.

In step 445, the processing circuit 118 in this embodiment removes the values $V1_{n-M}$, $V2_{n-M}$, $V3_{n-M}$, $I1_{n-M}$, $I2_{n-M}$ from the memory 118c, and stores $V1_n$, $V2_n$, $V3_n$, $I1_n$, $I2_n$ in the memory 118c. In this manner, the processing circuit 118 maintains in memory the last M values of the various RMS voltage and current values used to determine resistance. It will be appreciated that at least some of these values may be maintained longer, particularly if the values are used for other purposes within the processing circuit 118.

In the embodiment of FIG. 4, it will be appreciated that the maximum time interval between time samples t1 and t2 in calculation of equations (1), (2), (3) and/or (14) will be M*N. It will be appreciated that M and N may suitably take on any number of values. As discussed above, however, it is preferred that the product of M and N not exceed an hour or two, as the temperature of the voltage sensors 114a, 114b, 114c can change, thus affecting the accuracy of measurement. In one embodiment, a technician or other party may program the values of M and/or N by communicating the values and appropriate commands via the communication circuit 122 from the external device.

It will further be appreciated that contemporaneous with the operations of FIGS. 3 and/or 4, the processing circuit 118 generates energy calculations based on samples received from the voltage sensors 114a, 114b, and the current sensors 116a, 116b. However, it will be appreciated that while the processing circuit 118 uses RMS or peak values for the values V1, V2, V3, I1 and I2, the processing circuit 118 typically uses individual samples of the voltage measurement signals and the current measurement signals to generate energy calculations, as is known in the art. As discussed above, the processing circuit 118 may suitably cause one of or more energy calculation values to be displayed on the display 128.

In alternative embodiments, it is possible that the processing circuit 118 can perform the calculations of RC1 and RC2 even in the absence of a substantial change in current. In such a case, however, it may be advantageous for the processing circuit 118 to nevertheless determine whether the current change from t1 to t2 for a given RC1 or RC2 calculation exceeds a predetermined threshold, and to store the calculated RC1 and RC2 values in different locations in the memory 118c and/or 118d depending on whether the load current change from t1 to t2 exceeds the threshold.

As discussed above, the processing circuit 118 may store each calculated RC1 and RC2 value as a record that includes a time stamp. Such a record may include, in addition or in the alternative to the time stamp, an identification of the load current change (e.g. $I1_{t1} - I1_{t2}$) that corresponds to the RC1 or RC2 calculation.

As also discussed above, the processing circuit 118, or an external device, may suitably average several RC1 calculations to obtain a filtered RC1 value. Other statistical processing may also be used. In some embodiments, the number of resistance measurements used to generate the average or filtered value may be programmable via the communication circuit 122, and stored in the memory 118d.

It will further be appreciated that due to the nature of processing devices, the calculations of Equations (1), (2), (3) and (15) will necessarily be accomplished over several steps. The order of such steps may be varied while still implementing the same overall calculation.

The above-described embodiments are merely illustrative, and that those of ordinary skill in the art may readily devise their own implementations and modifications that incorporate the principles of the present invention and fall within the spirit and scope thereof.

For example, the above-described concepts may be adapted for use in a meter configuration that measures two currents with only a single current sensor, i.e., a CT with two primary conductors (power lines). This configuration is common in the resident three-wire single phase meter. In such a case, only the sum of both currents is measured and not the individual currents themselves. In this meter design, the method described to measure contact resistance can still be used, but instead of determining two separate contact resistance values, an average contact resistance value is determined.

Alternatively, another option in a three-wire single phase meter with a single current sensor is to partition the 'average' current measured between the right and left circuits based on the relative value of the voltage change as a result of the current change. The right and left circuits are the two conductors on which current is measured in a three-wire single phase meter. In such a case, if the voltage change on the right circuit is twice that of the left circuit then the current will be partitioned so that ⅔ of the average current is attributed to the right circuit and ⅓ to the left circuit. The process may then be carried out substantially as discussed above in connection with FIGS. 3 and 4.

I claim:

1. A method of measuring a resistance of an element, comprising:
    a) electrically coupling at least one power line to at least one customer load feeder line through the element to provide AC line voltage to the customer load via the at least one feeder line;
    b) obtaining a first voltage measurement value V1A from a first side of the element at a first time, the element operably coupled to receive the AC line voltage;
    c) obtaining a second voltage measurement value V2A from a second side of the element at the first time;
    d) obtaining a first current measurement value IA through the element at the first time;
    e) obtaining a third voltage measurement value V1B from the first side of the element at a second time;
    f) obtaining a fourth voltage measurement value V2B from the second side of the element at the second time;
    g) obtaining a second current measurement value IB through the element at the second time; and
    h) using a processing device to determine the resistance at least in part based on a voltage value and a current value, the voltage value being determined at least in part based on:
        a first change between V1A and V1B from the first side of the element between the first time and the second time, respectively, and a second change between V2A and V2B from the second side of the element between the first time and the second time, respectively, and the current value being determined at least in part based on:
a third change between V1A at the first side of the element at the first time and V2B at the second side of the element at the second time and a fourth change between IA at the first time and IB at the second time.

2. The method of claim 1, wherein the step h) further comprises using the processing device to determine the resistance at least in part based on a quotient of the voltage value divided by the current value, the determining of the voltage value further comprising:
determining the first change corresponding to a quotient of V1A divided by V1B, and determining the second change corresponding to V2A subtracted from a value of V2B multiplied by the first change, and
the determining of the current value further comprising:
determining the third change corresponding to a quotient of V1A divided by V2B and determining the fourth change corresponding to a value of IB multiplied by the third change subtracted from IA.

3. The method of claim 2, wherein the processing circuit is operably coupled to a measurement circuit configured to generate, at least in part, one of the values V1A and V2A.

4. The method of claim 1, wherein step b) further comprises obtaining a first analog voltage measurement and generating a first digital signal from the first analog voltage measurement, the first digital signal comprising the first voltage measurement value V1A.

5. The method of claim 4, wherein step c) further comprises obtaining a second analog voltage measurement from a voltage measurement circuit and generating a second digital signal from the second analog voltage measurement, the second digital signal comprising the second voltage measurement value V2A.

6. The method of claim 5, wherein step h) further comprises determining the resistance at least in part based on a quotient of the voltage value divided by a product of the current value multiplied by an accuracy value K2, the accuracy value K2 corresponding to the voltage measurement circuit.

7. The method of claim 1, further comprising using the processing device to determine whether the value IB differs from the value IA by more than a threshold amount, and
wherein the step h) further comprises using the processing device to determine the resistance responsive to a determination that the value IB differs from the value IA by more than the threshold amount.

8. A method, comprising:
a) electrically coupling at least one power line to at least one customer load feeder lines through a portion of an electricity meter, the portion being electrically conductive, to provide AC line voltage to the customer load via the at least one feeder line;
b) obtaining a first voltage measurement from a first side of the portion of the electricity meter at a first time;
c) obtaining a second voltage measurement from the first side of the portion at a second time;
d) obtaining a first current measurement through the portion at the first time;
e) obtaining a second current measurement through the portion at the second time;
f) using a processing device to determine whether the first current measurement differs from the second current measurement by more than a predetermined amount;
g) responsive to the determination that the first current measurement differs from the second current measurement by more than the predetermined amount, using the processing device to determine the resistance at least in part based on the first voltage measurement, the second voltage measurement, the first current measurement, and the second current measurement; and
h) causing a display of an indicator if the determined resistance exceeds a predetermined threshold.

9. The method of claim 8, wherein a second side of the portion is coupled to ground.

10. The method of claim 8, wherein step g) further comprises determining the resistance further based on a third voltage measurement of a second side of the portion at the first time, and a fourth voltage measurement of the second side of the portion at the second time.

11. The method of claim 8, wherein step f) further comprises using the processing device to determine whether the first current measurement differs from the second current measurement by more than a predetermined amount only if a time length between the first time and the second time is below a predetermined time amount.

12. The method of claim 11, wherein the predetermined time amount is less than two hours.

13. The method of claim 11, wherein the predetermined time amount is less than fifteen minutes.

14. The method of claim 8, further comprising using the processing circuit to calculate at least one energy consumption value based at least in part on at least one voltage measurement and at least one current measurement.

15. The method of claim 8, wherein the processing circuit is disposed within an electricity meter housing.

16. A circuit for use in an electricity meter, comprising:
a first voltage measurement circuit coupled to a first side of a portion of the electricity meter, the portion being electrically conductive, to provide AC line voltage to a customer load via at least one feeder line,
a second voltage measurement circuit coupled to a second side of a portion of the electricity meter,
a current measurement circuit operably coupled to the portion to obtain current measurements current flowing through the portion;
a processing circuit operably coupled to the first voltage measurement circuit, the second voltage measurement circuit, and the current measurement circuit, the processing circuit being configured to:
obtain voltage measurement values V1A and V1B corresponding, respectively, to a first time and a second time, the voltage measurement values V1A and V1B representative of voltage measurements from the first voltage measurement circuit;
obtain voltage measurement values V2A and V2B corresponding, respectively, to the first time and the second time, the voltage measurement values V2A and V2B representative of voltage measurements from the second voltage measurement circuit;
obtain current measurement values IA and IB corresponding, respectively, to the first time and the second time, the current measurement values IA and IB representative of current measurements from the current measurement circuit;
wherein the processing circuit is configured to determine a resistance of the portion based at least in part on V1A, V1B, V2A, V2B, IA and IB.

17. The circuit of claim 16, further comprising:
at least one analog-to-digital converter coupled between the first voltage measurement circuit and the processing circuit, and between the second voltage measurement circuit and the processing circuit.

18. The circuit of claim 17, wherein the processing circuit and the at least one analog-to-digital converter are housed within a single chip package.

19. The circuit of claim 16, wherein the processing circuit is configured to determine a resistance of the portion using at least in part the following relationship:

$$\frac{\left\{V2B\left(\frac{V1A}{V1B}\right)-V2A\right\}}{\left\{IA-\left(\frac{V1A}{V2B}\right)IB\right\}}.$$

20. The circuit of claim 16, wherein the second voltage measurement circuit has a measurement error represented by an error value K2, and wherein the processing circuit is configured to determine the resistance of the portion using the following relationship:

$$\frac{1}{K2}\frac{\left\{V2B\left(\frac{V1A}{V1B}\right)-V2A\right\}}{\left\{IA-\left(\frac{V1A}{V2B}\right)IB\right\}}.$$

21. The circuit of claim 18, wherein the portion comprises a switch element coupled to receive AC mains power.

* * * * *